United States Patent [19]

Dean

[11] 3,878,486

[45] Apr. 15, 1975

[54] HIGH FREQUENCY DEVICE ASSEMBLY

[75] Inventor: Raymond Harkless Dean, Lawrenceville, N.J.

[73] Assignee: RCA Corporation, New York, N.Y.

[22] Filed: July 11, 1973

[21] Appl. No.: 378,269

[52] U.S. Cl. ................ 333/24 R; 333/21 R; 333/27; 333/35; 333/84 M

[51] Int. Cl. ...... H01p 3/08; H01p 5/08; H01p 1/16

[58] Field of Search ....... 333/24 R, 84 M, 21 R, 27, 333/7 D, 6–9, 33, 35

[56] References Cited

UNITED STATES PATENTS

| | | | |
|---|---|---|---|
| 3,503,015 | 3/1970 | Coraccio et al. | 333/7 D |
| 3,568,099 | 3/1971 | Chao | 333/17 L |
| 3,593,205 | 7/1971 | Coraccio et al. | 333/7 D |
| 3,638,148 | 1/1972 | Hallford et al. | 333/84 M |
| 3,676,744 | 8/1970 | Pennypacker et al. | 333/9 X |
| 3,743,979 | 7/1973 | Schor | 333/79 |

*Primary Examiner*—Eli Lieberman
*Assistant Examiner*—Marvin Nussbaum
*Attorney, Agent, or Firm*—Edward J. Norton; Joseph D. Lazar

[57] ABSTRACT

A high frequency device, such as a microwave semiconductor device or integrated circuit, is mounted on a base plate with at least one terminal extending through the base plate and electrically connected to the device. The base plate is mounted in and extends across one end of a passage in a metal housing. A pair of coaxial terminals are mounted on the housing and have terminal pins which extend through the housing to the passage and are electrically connected to the device. The base plate terminals permit DC biasing the device with the coaxial terminals providing the RF connections to the device.

4 Claims, 4 Drawing Figures

HIGH FREQUENCY DEVICE ASSEMBLY

BACKGROUND OF THE INVENTION

The invention herein disclosed was made in the course of or under a contract or subcontract thereunder with the Department of the Air Force.

The present invention relates to a small compact assembly for a high frequency device, such as a microwave semiconductor device or integrated circuit, which provides for both RF connections and DC biasing connections to be made to the high frequency device.

Solid state devices, such as individual semiconductor devices and integrated circuits which include both active semiconductor devices and passive devices, are generally assembled in protective packages. The packages for solid state devices which operate at high frequencies, such as above about 2 GHz, must not only have the good mechanical and thermal properties that are required for packages previously used for lower frequency operating solid state devices, but also must have minimum lead lengths and lower interelectrode capacitance to minimize parasitic inductances and capacitances. In addition, many high frequency solid state devices require not only terminals for RF input and output but also terminals for applying a DC bias to one or more parts of the device. Thus, the package assembly for high frequency solid state devices must be capable of providing all of the requirements of the high frequency solid state device and still be small and compact and relatively easy to assemble.

SUMMARY OF THE INVENTION

A high frequency device assembly includes a housing having a passage therethrough. A base plate is mounted in and extends across the passage in the housing adjacent one end thereof. A high frequency device is mounted on the base plate within the passage. At least one terminal extends through the base plate and is electrically connected to the high frequency device. At least one coaxial terminal is mounted on the housing and has a conductor pin extending through the housing to the passage and is electrically connected to said high frequency device.

DETAILED DESCRIPTION

Figure 4:
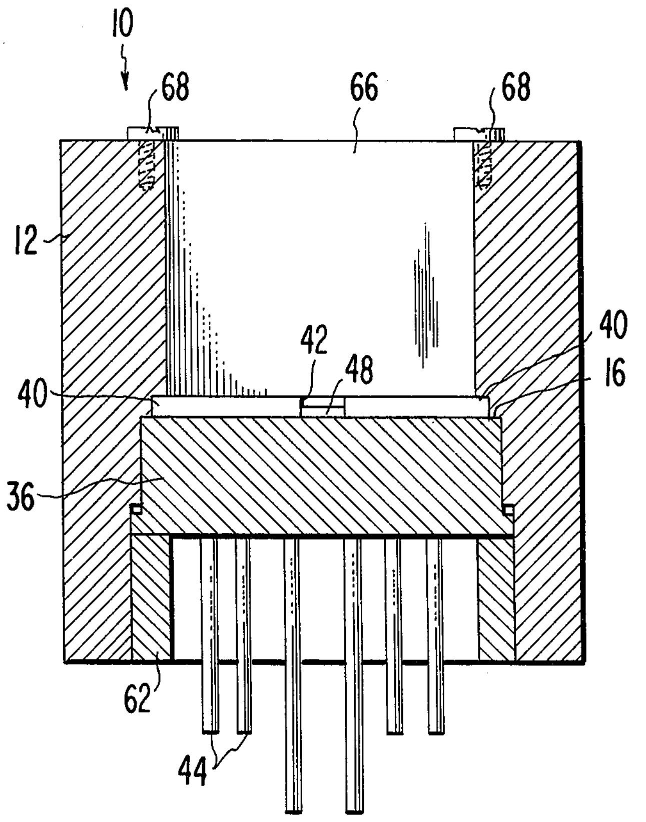
FIG. 4 is a sectional view taken along line 4—4 of FIG. 3.

Referring to the drawings, a form of the high frequency device assembly of the present invention is generally designated as 10. Assembly 10 comprises a housing 12 of an electrically and thermally conductive metal, such as copper, having a passage 14 therethrough. The housing 12 is shown as being rectangular in shape with the passage 14 extending between two opposed surfaces. However, the housing 12 can be of any desired shape. The passage 14 is circular in transverse cross-section and is counterbored at one end to provide a shoulder 16 (see FIGS. 2 and 4). A pair of diametrically opposed, longitudinally extending notches

Figure 3:
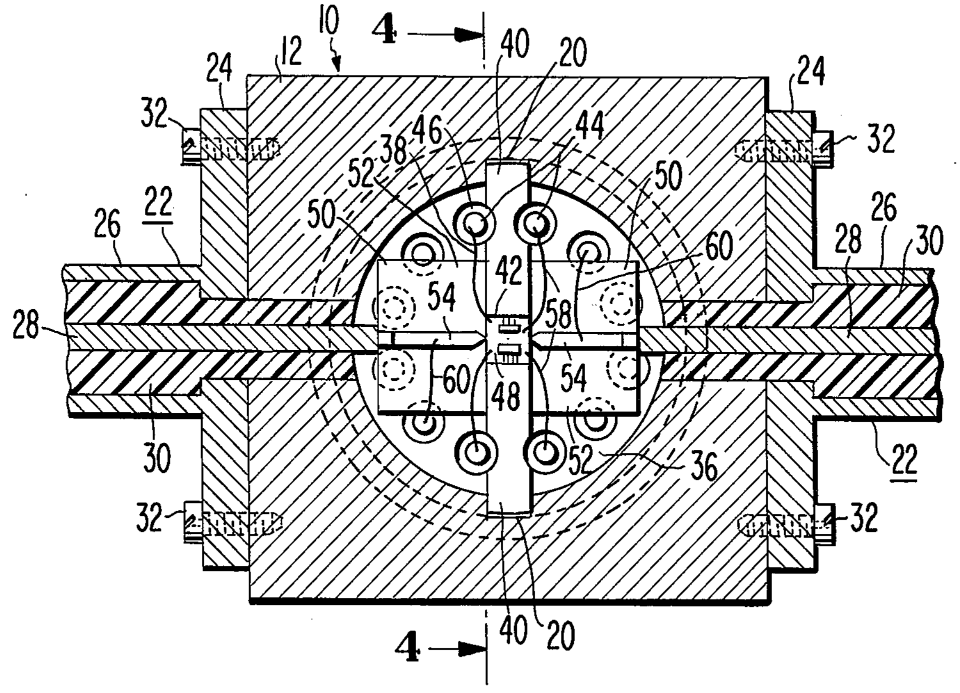
FIG. 3 is a sectional view taken along line 3—3 of FIG. 2.

20—20 are provided in the wall of the passage 14 (see FIG. 3).

A separate coaxial terminal 22 is mounted on each of two opposed sides of the housing 12. Each of the coaxial terminals 22 includes a mounting plate 24 and a cylindrical outer wall 26, integral with and extending perpendicularly from the mounting plate 24. The mounting plate 24 and the outer wall 26 are of an electrically conductive metal. A metal pin 28 extends coaxially through the outer wall 26, and a sleeve 30 of an electrical insulating material, such as a plastic, surrounds the pin 28 and completely fills the space between the pin 28 and the outer wall 26.

Each of the mounting plates 24 is secured to its respective side of the housing 12 by screws 32 with the outer wall 26 extending perpendicular to the longitudinal axis of the passage 14 in the housing 12. Each of the pins 28 extends through an opening 34 in the housing 12 and projects a short distance into the passage 14 (see FIG. 2). Each of the insulating sleeves 30 also extends through the opening 34 to insulate the pin 28 from the housing 12.

A base plate 36 of an electrically conductive metal fits in and extends completely across the counterbored end of the passage 14 in the housing 12. The base plate 36 is seated against the shoulder 16 of the passage 14. A metal rib 40 projects from the top surface of the base plate 36 and extends diametrically across the base plate 36. The ends of the rib 40 fit into the notches 20 in the wall of the passage 14, as shown in FIG. 3. The rib 40 and notches 20 are positioned such that the rib extends substantially perpendicular to the longitudinal axes of the pins 28 of the coaxial terminals 22. The rib 40 has a notch 42 across the center thereof. A plurality of terminal wires 44 extend through the base plate 36 and are positioned along a circle adjacent the periphery of the base plate 36. The portion of each of the terminal wires 44 which extends through the base plate 36 is surrounded by a sleeve 46 of an insulating material, such as a plastic or ceramic. The insulating sleeves 46 mechanically secure the terminal wires 44 to the base plate 36 and electrically insulate the terminal wires from the base plate. All of the terminal wires 44 are of a length to extend out of the passage 14. Some of the terminal wires 44 project above the top surface of the base plate 36 and some of the terminal wires 44 are flush with the top surface of the base plate.

Figure 1:
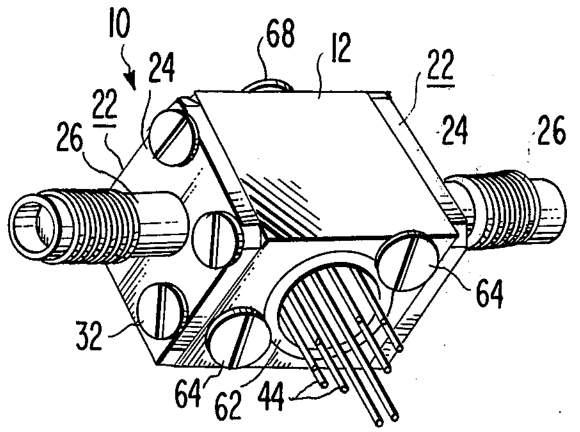
FIG. 1 is a perspective view of a form of a high frequency device assembly of the present invention.
Figure 2:
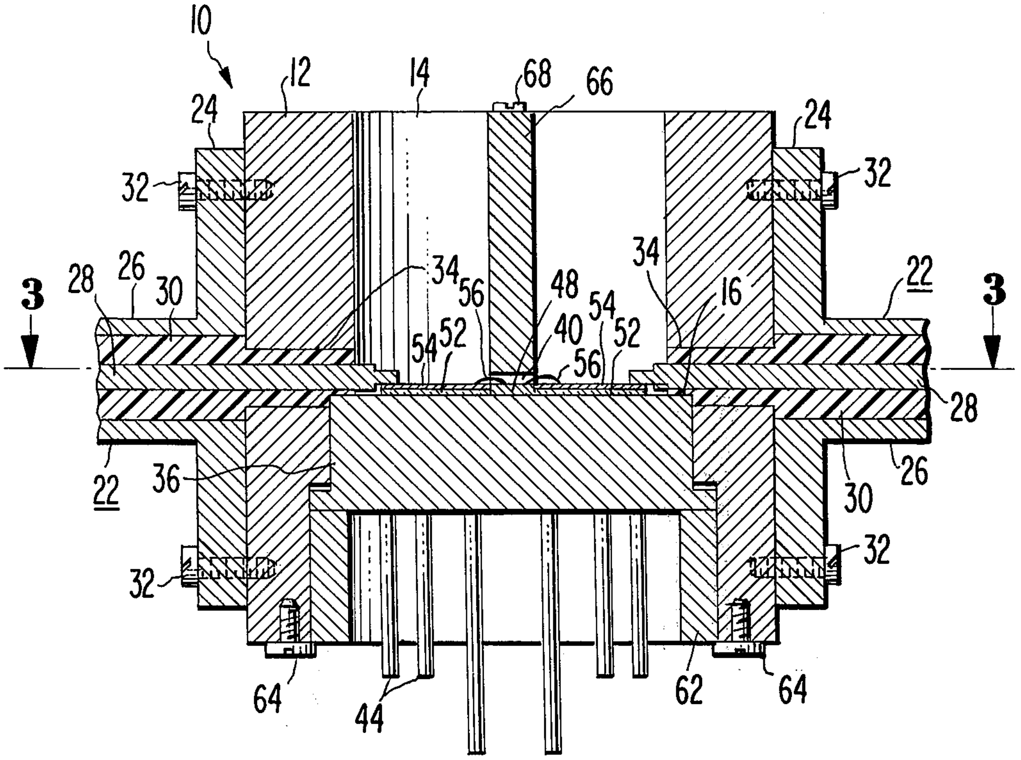
FIG. 2 is a sectional view of the assembly.

A high frequency device 48 is mounted on the base plate 36 within the notch 42 in the rib 40. The high frequency device 48 may be a semiconductor device or a microwave integrated circuit which includes one or more semiconductor devices and related passive devices. Microstrip circuit plates 50 are mounted on the base plate 36 at each side of the rib 40. Each of the microstrip circuit plates 50 includes a plate 52 of an insulating material, such as a ceramic, and a metal film strip 54 on the upper surface of the insulating plate 52. The bottom surface of the insulating plate 52 may also be coated with a metal film, not shown, to permit the microstrip circuit plate 50 to be secured to the base plate 36, such as by soldering or brazing. The metal film strip 54 of each of the microstrip circuit plates 50 extends from the high frequency device 48 to the end of a pin 28 of a coaxial terminal 22. As shown in FIG. 2, the end of each of the coaxial terminal pins 28 extends over and contacts the metal film strip 54 of the adjacent microstrip circuit plate 50 to provide an electrical connection between the pin and the metal film strip. Also as shown in FIG. 2, the metal film strip 54 of each of the microstrip circuit plates 50 is electrically connected to the high frequency device 48 by wires 56. As shown in FIG. 3, certain of the terminal wires 44 are electrically connected to the high frequency device 48 by wires 58 and certain of the terminals 44 are electrically connected to the metal film strip 54 of the microstrip circuit plate 50 by wires 60. If desired, various passive elements, such as capacitors and resistors, may be mounted on the microstrip circuit plates 50 to tune the circuit and/or adjust the impedance of the microstrip plate 50.

An annular locking ring 62 is within the counterbored end of the passage 14 in the housing 12 and engages the bottom of the base plate 36. The locking ring 62 is secured within the passage 14 by headed screws 64 which are threaded into the housing 12 and engage the end of the locking ring. A metal plate 66 is within the passage 14 of the housing 12 over the base plate 36. The plate 66 extends diametrically across the passage 14 directly over the rib 40 so as to cover the rib 40 and the high frequency device 48. The plate 66 is of a length to extend from the rib 40 to the end of the passage 14. Headed screws 68 are threaded into the housing 12 and engage the end of the plate 66 to secure the plate within the passage 14.

In the high frequency device assembly 10, the pins 28 of the coaxial terminals 26 are electrically connected to the high frequency device 48 through the metal film strips 54 of the microstrip circuit plates 50 and the wires 56, and serve as the RF input and output terminals for the assembly. The terminal wires 44 are electrically connected to the high frequency device 48 or the microstrip circuit plates 50 to serve as the DC biasing terminals for the assembly. In the use of the high frequency device assembly 10, the outer walls 26 of the coaxial terminals 22 are generally connected to ground. Since the outer walls 26 of the coaxial terminals 22 are electrically connected to the housing 12 through the mounting plates 24, the housing 12 and the base plate 36 are also grounded. Since the metal plate 66 contacts the rib 40 of the base plate 36, the metal plate 66 is grounded and serves to screen the circuitry on one of the microstrip circuit plates 50 from the circuitry on the other microstrip circuit plate 50.

It is preferable that the high frequency device assembly 10 be of a size such that the typical overall dimension is about one-half of an electromagnetic wavelength in free space at the operating frequency of the assembly. Thus, if the high frequency device assembly 10 is to be operated with a frequency of 12 GHz, the dimensions across the housing 12 should be about 0.5 inches. By so dimensioning the high frequency assembly 10, the distance from the pin 28 to the edge of the mounting plate 24 of each of the coaxial terminals 22 is about one-fourth wavelength. Likewise, the distance from the shoulder 16 of the housing 12, which is contacted by the base plate 36, to the end of the passage 14, as well as the distance between the midpoint of the plate 66 and the wall 14 of the housing, are each about one-fourth wavelength. These one-fourth wavelength distances provide better electrical connections between the housing 12 and each of the coaxial terminal mounting plates 24, base plate 36, and plate 66, since at one end of such a one-fourth wavelength distance there is in essence an electrical short. In addition, the length of each of the metal film strips 54 of the microstrip circuit plates 50 is approximately one-fourth wavelength in the dielectric of the plate 52 which provides for distributed impedance matching between the high frequency device 48 and each of the coaxial terminal pins 28.

To make the high frequency device assembly 10, the high frequency device 48 and the microstrip circuit plates 50 are mounted on the base plate 36 prior to inserting the base plate 36 within the passage 14. The wires 56, 58, and 60 are then connected between the high frequency device 48, microstrip circuit plate 50 and terminal wires 44. The base plate 36 with the high frequency device 48 and microstrip circuit plates 50 mounted thereon is then inserted in the passage 14 of the housing 12. This automatically brings the ends of the coaxial terminal pins 28 into contact with the metal film strips 54 of the microstrip circuit plates 50 to electrically connect the coaxial terminals to the high frequency device 48. The locking ring 62 and the metal plate 66 are then inserted in the passage 14 and secured therein by screws 64 and 68, respectively. Thus, the high frequency device assembly 10 is relatively simple to assemble since all of the fine wire connections between the elements on the base plate 36 are made prior to inserting the base plate 36 within the housing 12 and the connection between the coaxial terminals 22 and the high frequency device is automatically made when the base plate 36 is inserted in the housing 12. The high frequency device assembly 10 also has the advantage that the base plate 36 can be easily removed to make any modifications to the circuitry on the base plate and then reinserted in the housing.

Although the high frequency device assembly 10 is shown as having twelve terminal wires 44 extending through the base plate 36, it can be provided with any desired number of the terminal wires depending on the number of DC biasing connections required for the high frequency device of the assembly. Also, although the high frequency device assembly 10 is shown as being two coaxial terminals 22 mounted on the housing 12, it can be provided with only one coaxial terminal or three or more coaxial terminals, depending on the number of RF terminal connections required by the high frequency device. Thus, there is provided by the present invention a high frequency device assembly which is compact, has good mechanical and thermal properties and includes both RF and DC biasing connections for the high frequency device. In addition, the high frequency device assembly is relatively simple to assemble and can be easily disassembled to permit modification of the high frequency device circuit contained therein.

I claim:

1. A high frequency device assembly comprising
   - a housing having a passage therethrough,
   - a base plate mounted in and extending across the passage in the housing,
   - a high frequency device mounted on said base plate within said passage,
   - at least one terminal extending through said base plate and electrically connected to said high frequency device, and
   - at least one coaxial terminal mounted on said housing, said coaxial terminal having a conductor pin extending through said housing to said passage and electrically connected to said high frequency device, said base plate having a metal rib projecting from and extending diametrically across its surface on which the high frequency device is mounted, said rib having a notch thereacross, said high frequency device being mounted within the notch and a pair of microstrip circuit plates being mounted on the base plate on opposite sides of the rib, each of said microstrip circuit plates including a metal film strip electrically connected to the high frequency device and to a separate coaxial terminal pin.

2. A high frequency device assembly in accordance with claim 1 including a pair of opposed notches in and extending longitudinally along the wall of the passage in the housing, and the ends of the rib on the base plate fit into said notches.

3. A high frequency device assembly in accordance with claim 1 including a metal plate within the passage in the housing over the rib on the base plate, said metal plate being seated on the rib and extending diametrically across the base plate to electrically screen the microstrip circuit plate on one side of the rib from the microstrip circuit plate on the other side of the rib.

4. A high frequency device in accordance with claim 1 in which the passage in the housing is counterbored at one end to provide a ledge spaced from said one end, the base plate is within the counterbored end of the passage and is seated against the ledge, and an annular locking ring is secured within the counterbored end of the passage and is seated against the base plate to secure the base plate within the passage.

* * * * *